US008144897B2

(12) United States Patent
Ranta

(10) Patent No.: US 8,144,897 B2
(45) Date of Patent: Mar. 27, 2012

(54) ADJUSTING ACOUSTIC SPEAKER OUTPUT BASED ON AN ESTIMATED DEGREE OF SEAL OF AN EAR ABOUT A SPEAKER PORT

(75) Inventor: Craig Eric Ranta, Kitchener (CA)

(73) Assignee: Research In Motion Limited, Waterloo (CA)

(*) Notice: Subject to any disclaimer, the term of this patent is extended or adjusted under 35 U.S.C. 154(b) by 1180 days.

(21) Appl. No.: 11/934,404

(22) Filed: Nov. 2, 2007

(65) Prior Publication Data

US 2010/0166223 A9 Jul. 1, 2010

(51) Int. Cl.
*H03G 3/00* (2006.01)

(52) U.S. Cl. ...................... 381/107; 381/104; 455/200.1; 455/569.1; 379/385.01; 379/388.02; 379/420.01; 379/420.02

(58) Field of Classification Search .................... 381/74, 381/98, 101, 102, 103, 104, 107, 108, 56, 381/58, 59; 379/388.01, 388.02, 422.01, 379/420.02, 433.02, 432; 455/569.1, 200.1
See application file for complete search history.

(56) References Cited

U.S. PATENT DOCUMENTS

| | | | | |
|---|---|---|---|---|
| 6,011,853 | A | 1/2000 | Koski et al. | |
| 6,639,987 | B2 * | 10/2003 | McIntosh | 381/71.6 |
| 7,331,245 | B2 * | 2/2008 | Nishimura et al. | 73/862.046 |
| 7,522,065 | B2 * | 4/2009 | Falcon | 340/686.6 |
| 2002/0068537 | A1 | 6/2002 | Shim et al. | |
| 2002/0101441 | A1 | 8/2002 | SanGiovanni | |
| 2003/0108209 | A1 * | 6/2003 | McIntosh | 381/74 |
| 2004/0259513 | A1 * | 12/2004 | Park | 455/200.1 |
| 2007/0113681 | A1 | 5/2007 | Nishimura et al. | |

FOREIGN PATENT DOCUMENTS

| | | | |
|---|---|---|---|
| EP | 1492314 | A2 | 12/2004 |
| WO | WO 2004/080116 | A2 | 9/2004 |

OTHER PUBLICATIONS

Varun Chopra, Active Leak Compensation in Receivers, Chalmers University of Technology, Sweden, 2005.

* cited by examiner

*Primary Examiner* — Vivian Chin
*Assistant Examiner* — David Ton

(57) ABSTRACT

A degree of seal of an ear about a speaker port may be estimated by detecting touch contact between the ear and at least one touch sensor in fixed relation to the speaker port. The degree of seal is estimated based on the detected touch contact. Based upon the estimated degree of seal, the acoustic output of the speaker may be adjusted. The adjustment may compensate for perceived changes to the quality of the acoustic output resulting from the degree of seal. The at least one touch sensor may be a plurality of touch sensors spaced around the speaker port. Each sensor may have a truncated wedge shape, with a narrow end closest to the speaker port. Upon receipt of user input indicative of a high degree of ear seal, a sample of the sensor(s) may be taken and stored for using during future estimation of the degree of seal.

12 Claims, 13 Drawing Sheets

ADJUSTING ACOUSTIC SPEAKER OUTPUT BASED ON AN ESTIMATED DEGREE OF SEAL OF AN EAR ABOUT A SPEAKER PORT

FIELD OF TECHNOLOGY

This disclosure relates to adjusting the acoustic output of a speaker based upon an estimated degree of seal of an ear about a speaker port.

BACKGROUND

Electronic devices (e.g. telecommunications device) that generate acoustic output (e.g. human speech) through a speaker typically comprise a housing having a speaker port and a speaker mounted within the housing in alignment with the speaker port. The term "speaker port" refers to aperture(s) or other structure that serve(s) as a pathway for sound from a transducer or diaphragm of the speaker (e.g. a hole or set of holes in the receiver portion of a cellular telephone). When using such an electronic device, a user may need to situate the speaker port near his or her ear so as to be able to hear the acoustic output. There are many different orientations in which the user may hold the device near his or her ear. For example, the user may press the speaker port against his or her ear such that his ear substantially surrounds the speaker port. In that case, the speaker plays into a small contained volume of air within the ear cavity. This is known as a sealed condition or as a "high degree of seal". Alternatively, the user may only touch part of his ear to the speaker port such that the speaker is substantially open to the environment. In that case, the speaker plays into a much larger volume of air. This is known as a leak condition or as a "low degree of seal".

A listener may perceive a change in the acoustic output of a speaker depending upon whether a leak or sealed condition exists. In the leak condition, a listener may perceive a loss of lower frequencies. Conversely, in a sealed condition, the listener may perceive an amplification of lower frequencies.

It has been proposed to distinguish between a sealed and leak condition by detecting the degree of movement of a speaker diaphragm as the speaker generates acoustic output. In a sealed condition, the diaphragm is more resistant to movement than in a leak condition. Thus, by detecting the degree of movement of the diaphragm, it may be possible to distinguish between the two conditions. In practice, however, detecting the degree of movement of the diaphragm may not be easily realizable. Because the degree of movement of the diaphragm is very slight, detecting fine differences in amplitude of a vibrating diaphragm may be problematic. This problem may be especially pronounced in the context of miniature speakers such as those found in mobile telecommunications devices. Moreover, different speakers, and even different models of the same type of speaker, may possess different characteristics of movement and therefore, knowledge of the characteristics of a particular speaker is often required.

An alternative approach for distinguishing between the sealed and leak conditions would be desirable. It would also be desirable to address the perceived degradation of sound quality that may result from these conditions.

DESCRIPTION OF THE DRAWINGS

Aspects and features of the disclosed method and device will become apparent to those of ordinary skill in the art upon review of the following description of specific embodiments in conjunction with the accompanying figures. In the figures which illustrate example embodiments.

DETAILED DESCRIPTION

In one aspect of the below described embodiment, there is provided a method of adjusting the acoustic output of a speaker, comprising: detecting touch contact between an ear and at least one touch sensor in fixed relation to a speaker port for the speaker; based on the detecting, estimating a degree of seal of the ear about the speaker port; and based on the estimated degree of seal, adjusting the acoustic output of the speaker.

In another aspect of the below described embodiment, there is provided an electronic device comprising: a housing having a speaker port; a speaker within said housing for providing acoustic output through the speaker port; at least one touch sensor in fixed relation to the speaker port; and a processor operable to: receive data representing touch contact between an ear and the at least one touch sensor; based on the received data, estimate a degree of seal of the ear about the speaker port; and based on the estimated degree of seal, adjust the acoustic output of the speaker.

In yet another aspect of the below described embodiment, there is provided a machine-readable medium storing instructions which, when executed by a processor of an electronic device having a speaker and at least one touch sensor in fixed relation to a speaker port for the speaker, causes said processor to: receive data representing touch contact between an ear and the at least one touch sensor; based on the received data, estimate a degree of seal of the ear about the speaker port; and based on the estimated degree of seal, adjust the acoustic output of the speaker.

In yet another aspect of the below described embodiment, there is provided a method of operating an electronic device, the device comprising: a housing having a speaker port; a speaker within the housing for providing acoustic output through the speaker port; at least one touch sensor in fixed relation to the speaker port; a memory; and a processor in communication with the memory operable to: receive data representing touch contact between an ear and the at least one touch sensor; based on the received data, estimate a degree of seal of the ear about the speaker port; and based on the estimated degree of seal, adjust the acoustic output of the speaker, the method comprising: causing the speaker to provide acoustic output through the speaker port; during or subsequent to the providing of the acoustic output, receiving user input indicating that the degree of seal of the ear about the speaker port is currently high; upon the receiving, sampling a degree of touch contact with the at least one touch sensor, the sampling resulting in a generated sample; and storing the generated sample in the memory for use during the estimating.

Figure 1:
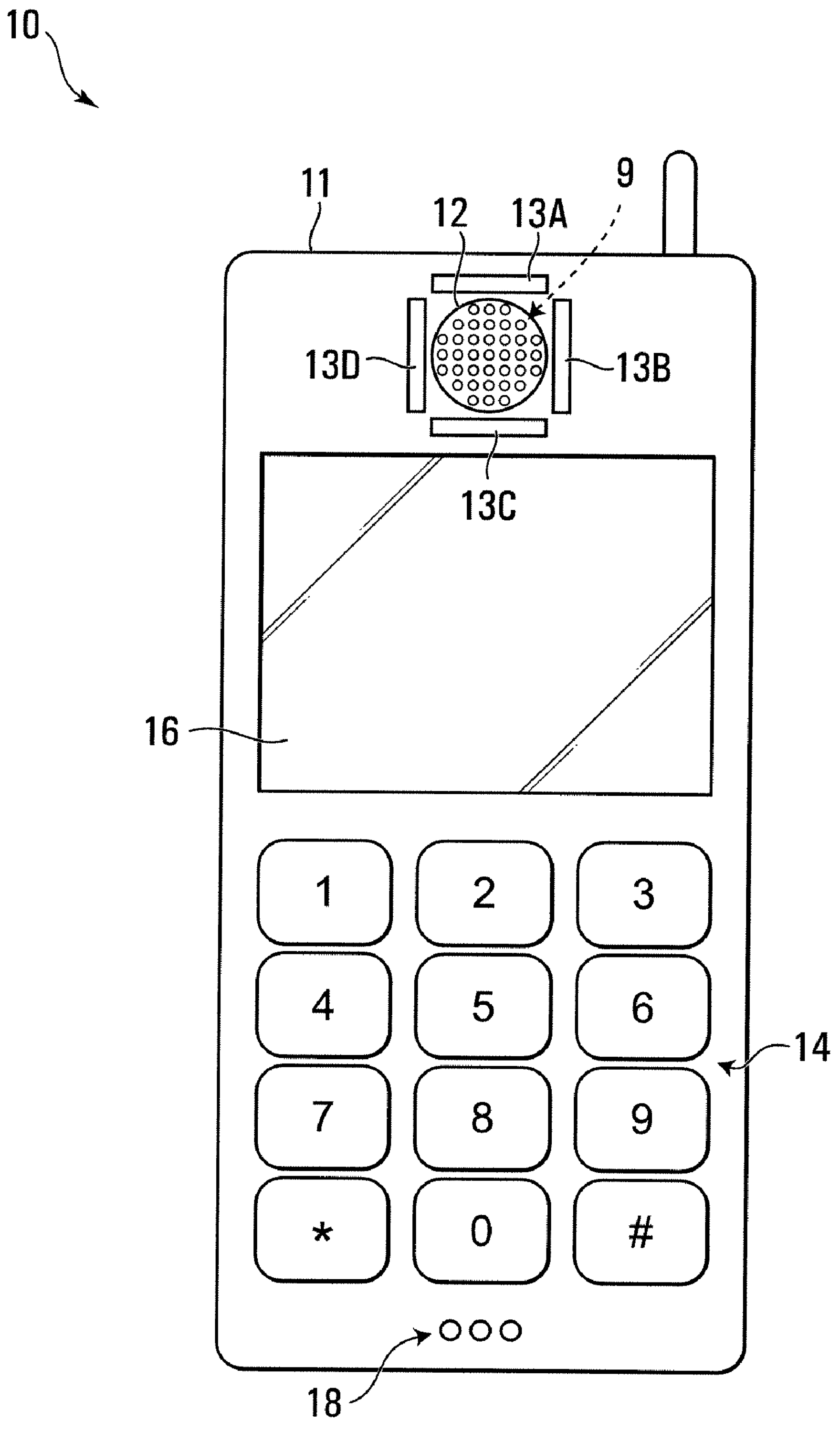
FIG. 1 shows an exemplary electronic device with a speaker port and touch sensors mounted in fixed relation to the speaker port.

FIG. 1 shows an exemplary electronic device 10, which in the present embodiment, is a telecommunications device. The telecommunications device may for example be a cellular telephone, smart phone, dual-mode telephone, WiFi telephone, cordless telephone, two-way pager with voice capability, or the like. The device 10 includes a housing 11 with a speaker port 12, a speaker 9 mounted within the housing, four touch sensors 13A, 13B, 13C, and 13D (collectively or individually sensors 13), a display (screen 16), an input device (keypad 14) and a microphone 18.

Speaker 9 is a conventional speaker that emits acoustic output, which in the present embodiment may be voice output. The speaker 9 (not visible in FIG. 1) is fixedly mounted within the housing in alignment with the speaker port 12. The speaker port 12 includes numerous small holes and generally has a circular shape, although it may have other shapes in other embodiments.

Touch sensors 13A, 13B, 13C and 13D are mounted to housing 11 in fixed relation to speaker port 12 in the north, east, south and west directions respectively. In the illustrated embodiment, touch sensors 13A-13D are rectangular and are mounted flush with the surface of housing 11, so that the speaker port 12 and the sensors are substantially coplanar. Each sensor has two operational states: on (when any part of the exposed sensor surface is touched) and off (when no part of the exposed sensor surface is touched). Each sensor 13A-13D may be on or off independently of the on or off states of the other sensors. As will be appreciated, the sensors 13 are used to detect touch contact of a user's ear about the speaker port 12. Based on the touch contact detected by sensors 13, a degree of seal of an ear about the speaker port 12 can be estimated.

Screen 16, keypad 14 and microphone 18, although not a focus of this description, are illustrated for the sake of completeness. Screen 16 is a conventional screen such as a Liquid Crystal Display (LCD). Other types of screens may be used in other embodiments (e.g. touch screen).

Keypad 14 is a conventional keypad by which numeric digits or text may be entered. The input devices may vary in other embodiments (e.g. may be a full QWERTY keyboard).

Microphone 18 is a conventional microphone that receives acoustic input, for example, voice input.

Figure 2:
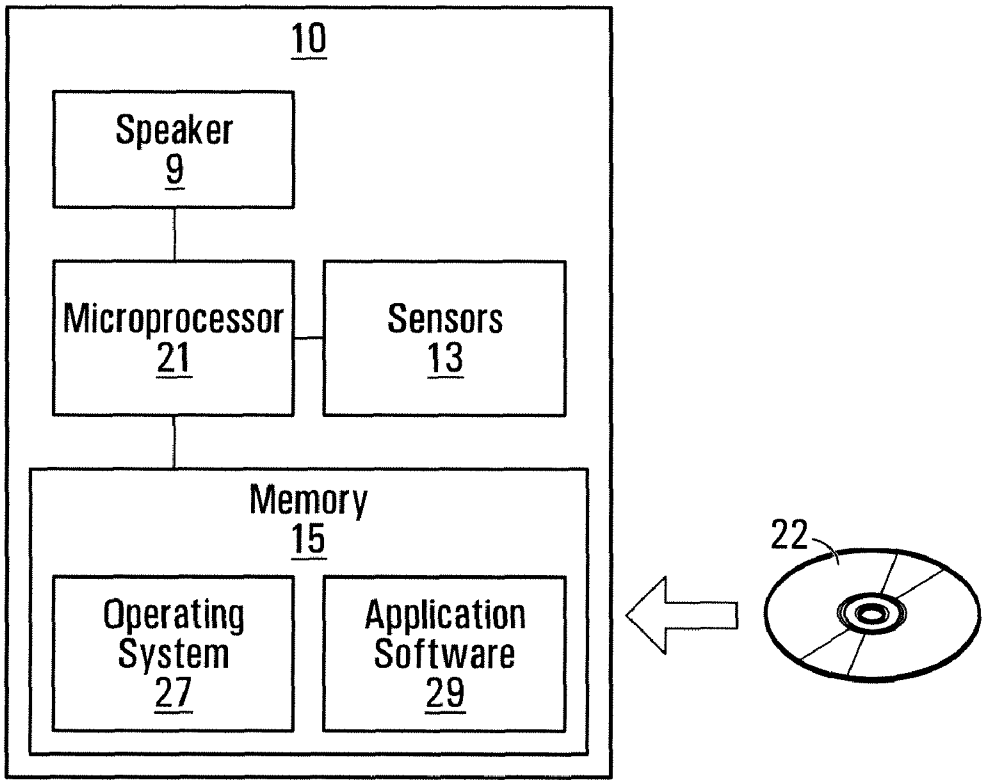
FIG. 2 is a simplified block diagram of the device of FIG. 1.

FIG. 2 is a simplified block diagram illustrating select components of device 10. As illustrated, device 10 includes a microprocessor 21 interconnected with a speaker 9, sensors 13 and memory 15. Microprocessor 21 generally controls operation of the device 10 through the execution of software stored in memory 15. The memory 15, which may comprise volatile memory, non-volatile memory or both, stores operating system software 27 and application software 29. In the present embodiment, operating system software 27 includes instructions which, when executed by microprocessor 21, adapt device 10 to adjust the acoustic output of speaker 12 based on an estimated degree of seal of an ear about the speaker port 12. The rationale for including these instructions within operating system software 27 may be to permit multiple applications at the device to benefit from this functionality. However, the instructions are not necessarily part of the operating system software of all embodiments. For example, in some embodiments, those instructions may form part of application software 29, which may be a telephony application, voice recording application, music player application or the like. Alternatively, the operation may be effected elsewhere in other embodiments (e.g. in firmware) or may be effected through instructions contained on a computer readable medium 22. The interconnection between microprocessor 21 and sensors 13 permits the microprocessor 21 to dynamically determine which sensor(s) 13A-13D (if any) are presently being touched by an ear of a user, as will be described.

Figure 3:
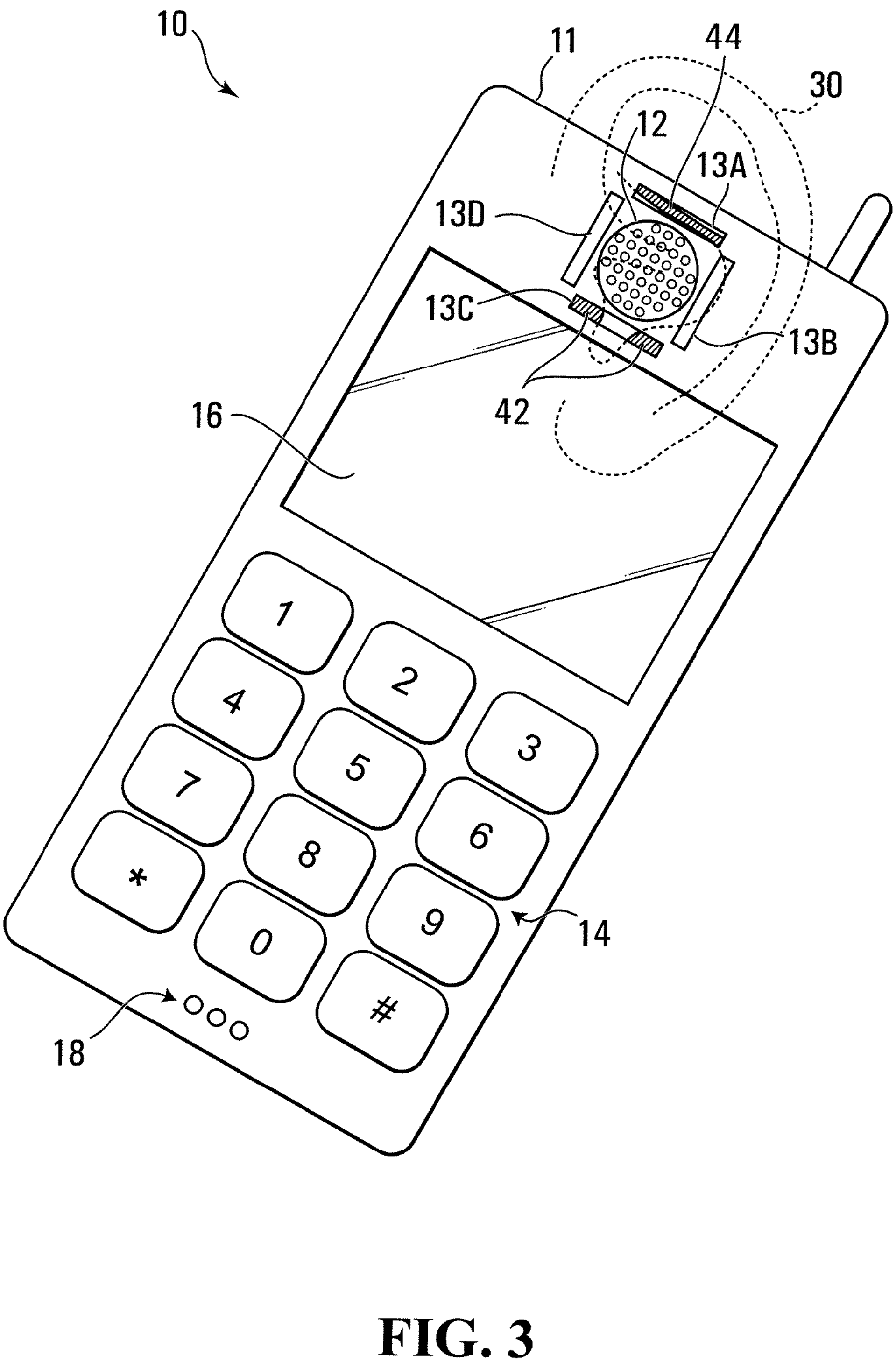
FIG. 3 shows the device of FIG. 1 with an ear touching the device at regions north and south of the speaker port, demonstrating a sealed condition.
Figure 4:
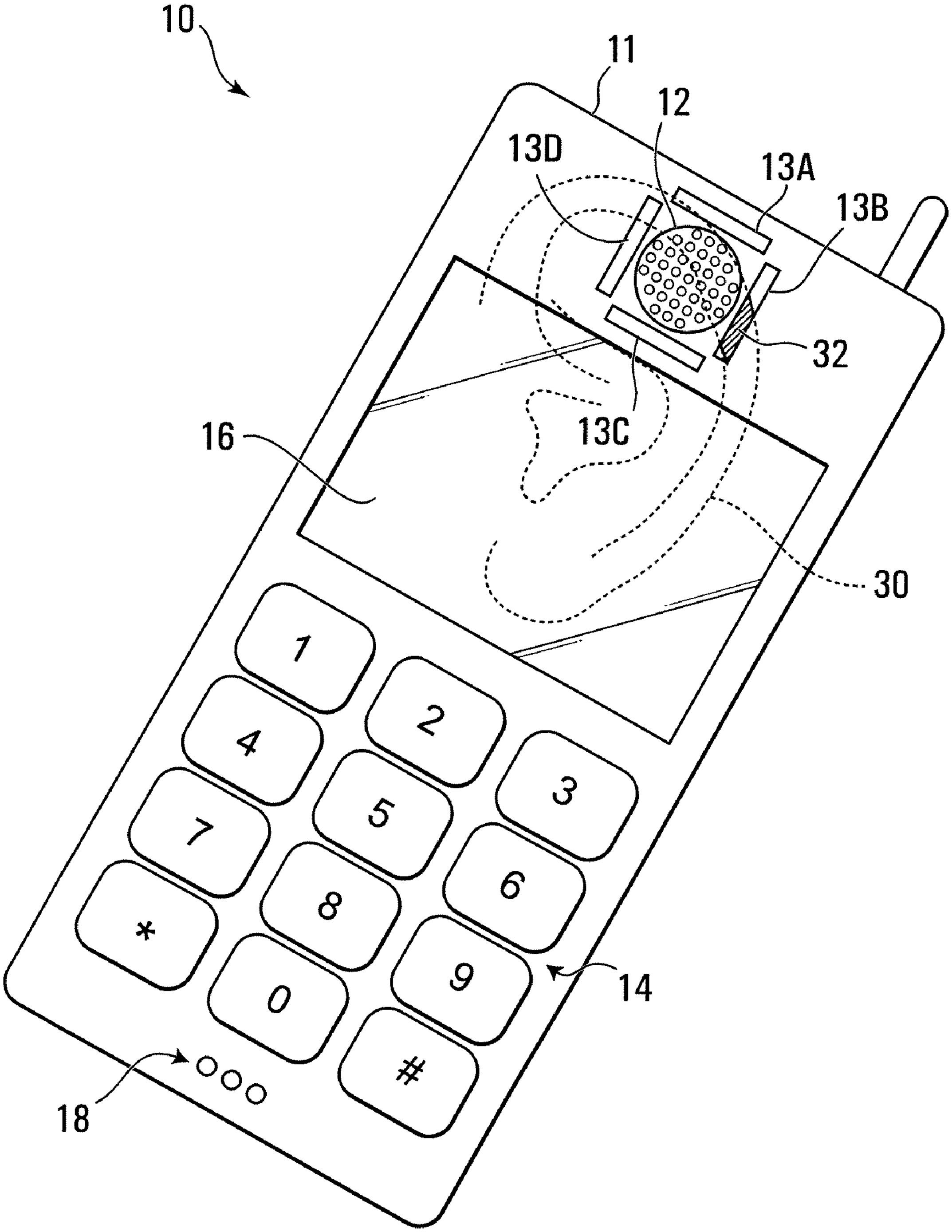
FIG. 4 shows the device of FIG. 1 with an ear touching the device at a region west of the speaker port, demonstrating a leak condition.

FIGS. 3 and 4 illustrate two different ways (of many) in which an ear of a user of device 10 may contact touch sensors 13 during use. FIG. 3 is exemplary of a sealed condition and FIG. 4 is exemplary of a leak condition. These figures will be described in the context of the following description of device operation.

Figure 5:
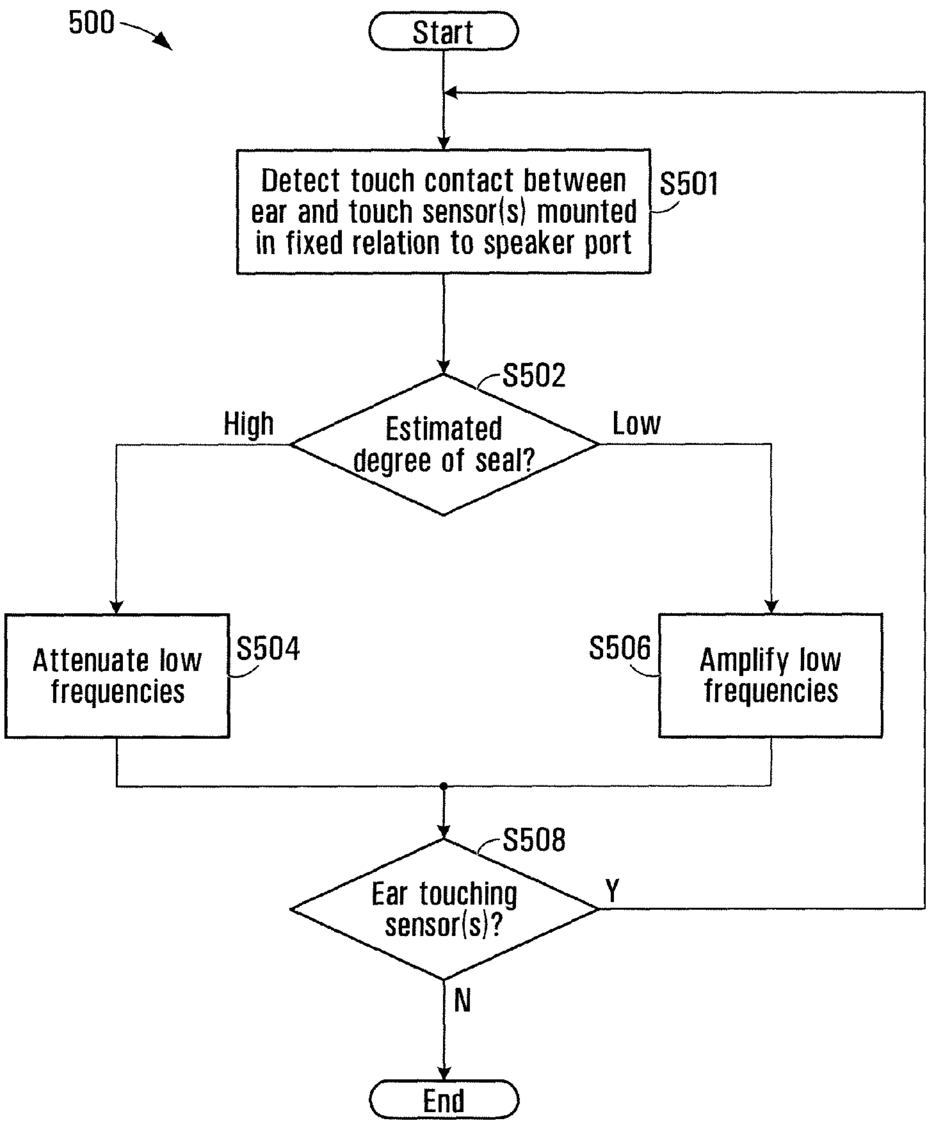
FIG. 5 is a flow diagram illustrating operation of the electronic device of FIG. 1.

Referring to FIG. 5, operation 500 for adjusting acoustic speaker output based on an estimated degree of seal of an ear about a speaker port is illustrated. It is assumed that the touch sensors 13A-13D are initially in an off state, i.e., are not being touched.

When a user wishing to listen to acoustic output from the device 10 (e.g. upon receipt of a telephone call) places the device 10 against his or her ear 30, the speaker port 12 will be aligned, more or less, with the ear. Depending upon the alignment of the ear 30 with the speaker port 12 and the orientation of the device 10 relative to the user's head, the ear 30 may touch one or more sensors 13, causing a transition of the sensor(s) from the off state to the on state. This is detected (S501) at the microprocessor 21 (FIG. 2), e.g., in the form of one or more interrupts generated in response to sensor activation.

Responsive to the detection of touch contact between the ear 30 and at least one of the sensors 13, the microprocessor engages in processing for estimating the degree of seal of the ear about the speaker port (S502, FIG. 5). In the present embodiment, this processing is capable of estimating two degrees of seal: high (i.e. a sealed condition) or low (i.e. a leak condition).

The degree of seal is estimated to be high when two sensors located on opposite sides of speaker port 12 are on simultaneously. This scenario is illustrated in FIG. 3. As illustrated, an ear 30 of the user contacts region 44 within the boundaries of touch sensor 13A and region 42 within the boundaries of opposing touch sensor 13C, thus activating both sensors. On the basis of this simultaneous activation, a high degree of seal is estimated to exist. The conclusion would be the same if opposing sensors 13B and 13D had been simultaneously in the on state. As long as two opposing sensors are simultaneously on, the degree of seal is estimated to be high regardless of the on or off state of the other sensors.

Based on fact that the degree of seal is estimated to be high, the acoustic output of speaker 9 is adjusted by attenuating low frequencies (S504, FIG. 5), e.g., between 300 Hz and 1 KHz. This has the result of improving the quality of the sound perceived by the user, as the overall audio response perceived by the user will be equalized to a flat response, e.g., across the typical telephony frequency range of 300 Hz to 4 KHz. This is analogous to lowering the "low frequency" slider of a graphic equalizer audio component of a stereo system in order for the user to perceive the sound as though the slider knobs of the graphic equalizer were actually horizontally aligned ("flat response").

In contrast, the degree of seal is estimated to be low when the user's ear 30 touches only one of the sensors 13 or only two sensors that are adjacent to one another. This scenario, which may be described as the sensors on only "one side" (or on the "same side") of the speaker port 12 being on, is shown in FIG. 4. As illustrated in FIG. 4, there is only one region 32 of contact between the ear 30 and sensors 13, namely, within the boundaries of sensor 13B. Based on the activation of only sensor 13B and none of sensors 13A, 13C or 13D, the degree of seal is estimated to be low.

Based on fact that the degree of seal is estimated to be low, the acoustic output of speaker 9 is adjusted by amplifying low frequencies (S506), e.g., between 300 Hz and 1 KHz. This similarly has the result of improving the quality of the sound perceived by the user, again because the overall audio response perceived by the user will be equalized to a flat response. This is analogous to raising the "low frequency" slider of a graphic equalizer audio component in order for the user to perceive the sound as though the slider knobs of the graphic equalizer were actually horizontally aligned.

To assist in the identification of high versus low degrees of seal as described above, operating system software 27 may contain a function, for example, degreeOfSeal(sensor0, sensor1, sensor2, sensor3), which takes four parameters, sensor0, sensor1, sensor2 and sensor3, corresponding to touch sensors 13A, 13B, 13C and 13D, respectively. Each of parameters sensor0, sensor1, sensor2 and sensor3 contains the value "1" when its corresponding sensor is one and contains the value "0" when its corresponding sensor is off (of course, the parameters may take on values other than "1" and "0" to indicated the on/off states). Based upon the input parameters, the degreeOfSeal function outputs whether the degree of seal is estimated to be high or low. Specifically, the degreeOfSeal function returns HIGH when the input parameters indicate that a high degree of seal is estimated to exist, and returns LOW otherwise, indicating that a low degree of seal is estimated to exist. The following pseudocode shows an exemplary implementation of the degreeOfSeal function.

```
degreeOfSeal( sensor0, sensor1, sensor2, sensor3 ){
        if( (sensor0==1 & sensor2==1) OR
        (sensor1==1 & sensor3==1) ){
            return HIGH;
        } else {
            return LOW;
        }
    }
```

Thus, in the situation shown in FIG. 3, the degreeOfSeal function would be invoked as follows: degreeOfSeal(1, 0, 1, 0), and the function would return HIGH since the values of sensor0 and sensor2 are both "1". In contrast, in the situation shown in FIG. 4, the degreeOfSeal function would be invoked as follows: degreeOfSeal(0, 0, 0, 1). Because only sensor3 (corresponding to touch sensor 13D) contains the value "1", the degreeOfSeal function would return LOW.

If touch contact between ear 30 and sensor(s) 13 persists (S508), then operation S501, S502, and S504 or S506 is repeated. This repetition allows the acoustic output to be dynamically adjusted during the period of contact between the ear 30 and at least one touch sensor 13. Periodic estimation of degree of ear seal may be desirable because it is atypical for a person to hold a telecommunications device in the same position throughout the duration of a phone call. Moreover, changing characteristics of the environment (e.g. a degree of background noise) may influence the position in which the user holds the device (e.g. a user may press the speaker port tighter to his or her ear when moving into a noisy environment). The rate of sampling of ear position may be pre-set or may be set in other manners, for example, by the user through a GUI. Alternatively, a user may trigger re-estimation of ear seal by, for example, pressing a button.

When touch contact between ear 30 and touch sensor(s) 13 is no longer detected (S508), operation 500 terminates. The operation 500 may be repeated when touch contact is again detected.

In some embodiments, it may be sufficient to estimate a degree of seal and to adjust acoustic output accordingly only once, e.g., at the beginning of a telephone call. In such embodiments, operation 500 may terminate upon completion of S504 or S506.

If it is desired to better localize a point or points of contact between an ear and the device, more than four touch sensors may be used. For example, eight, twelve or sixteen sensors (or more) arranged around the speaker port 12 may be used. In such embodiments, the general approach of distinguishing a high degree of seal from a low degree of seal, i.e. detecting touch contact on opposite sides of the speaker port versus touch contact on only one side of the speaker port, is the same. However, in view of the greater number of sensors, the degreeOfSeal function would require modification. Generally, the degree of seal could be estimated to be high if opposing sensors are simultaneously on, and low otherwise. In such embodiments, activation of two (or more) adjacent sensors may be understood to represent a continuous area of contact.

Figure 6:
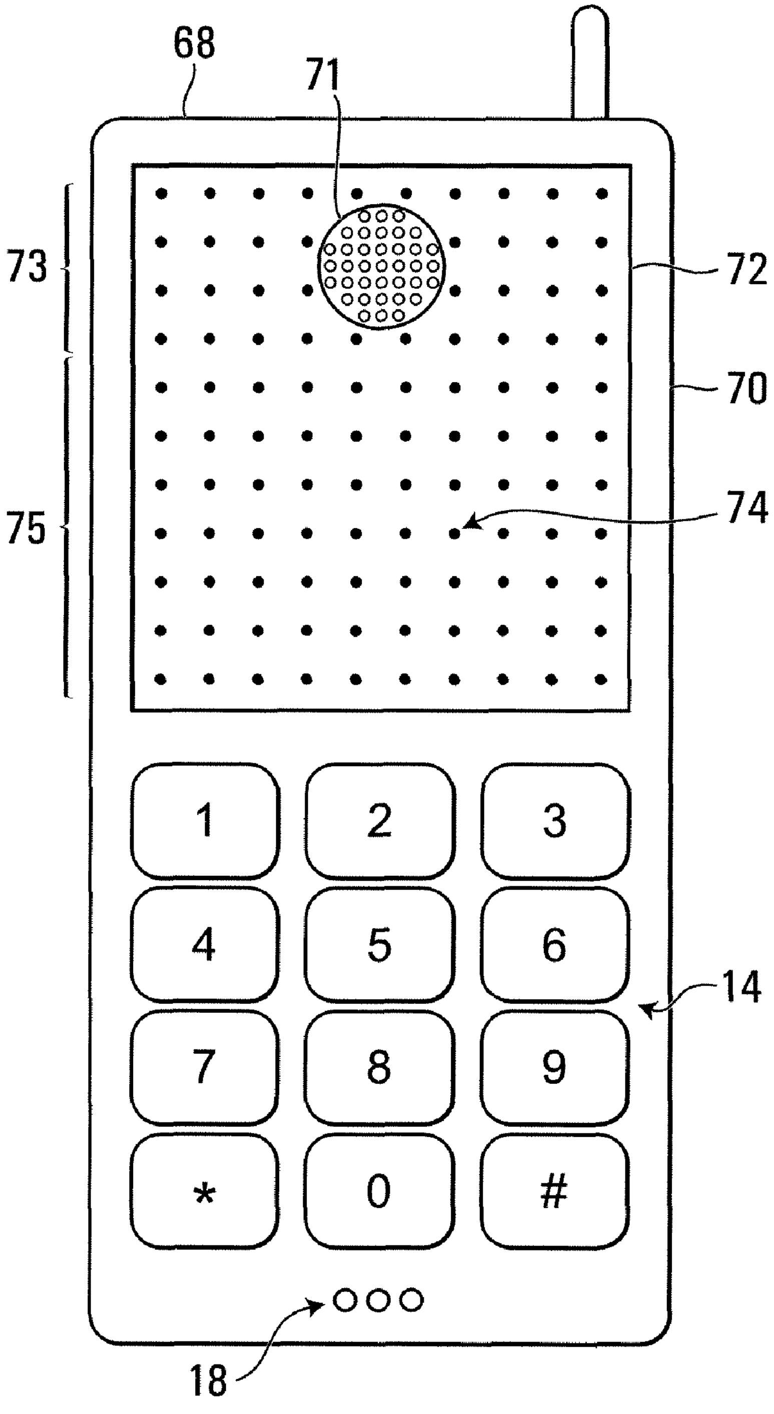
FIG. 6 shows an embodiment of an electronic device with a speaker port and touch screen sensors surrounding the speaker port.

It is possible that some embodiments could employ a single touchscreen capable of detecting multiple areas of touch contact. Although such touchscreens are not readily available in the marketplace at the time of this writing, it is envisioned that they may become readily available. An embodiment utilizing such a touchscreen is illustrated in FIG. 6. As illustrated, the electronic device 68 is has a housing 70 and speaker port 71 similar to the housing 11 and speaker port 12 of device 10 (FIG. 1). However, instead of display 16 and sensors 13, device 68 has a touchscreen 72 with a lower portion 75 and an upper portion 73. The lower portion 75 of touchscreen 72 may fulfill the same role as display 16 of FIG. 1, i.e. may be capable of displaying a GUI and may receive user input in the form of stylus or finger contact. The upper portion 73 surrounds the speaker port 71 and fulfills the role of sensors 13. The upper portion 73 of touchscreen 72 is capable of simultaneously detecting multiple areas of touch within its boundaries.

As illustrated in FIG. 6, touchscreen 72 has a plurality of touch sensors 74 arranged in a grid pattern. Each touch sensor may be generally identified by its Cartesian coordinates, namely, its x and y coordinates. When touched, a sensor transitions from the "off" state to the "on" state. This transition is indicated to microprocessor 21. When a region of touch spans multiple sensors 74 or when there are multiple regions of touch within the upper portion 73 of the touchscreen, the x and y coordinates of each activated sensor may for example be communicated to the microprocessor 21. This permits the microprocessor to detect multiple regions of touch contact within the upper portion 73 of touchscreen 72. This information is used to estimate a degree of seal of the ear about the speaker port 71, so that the acoustic output of the speaker may be appropriately adjusted as described above in conjunction with FIG. 5.

Figure 7A:
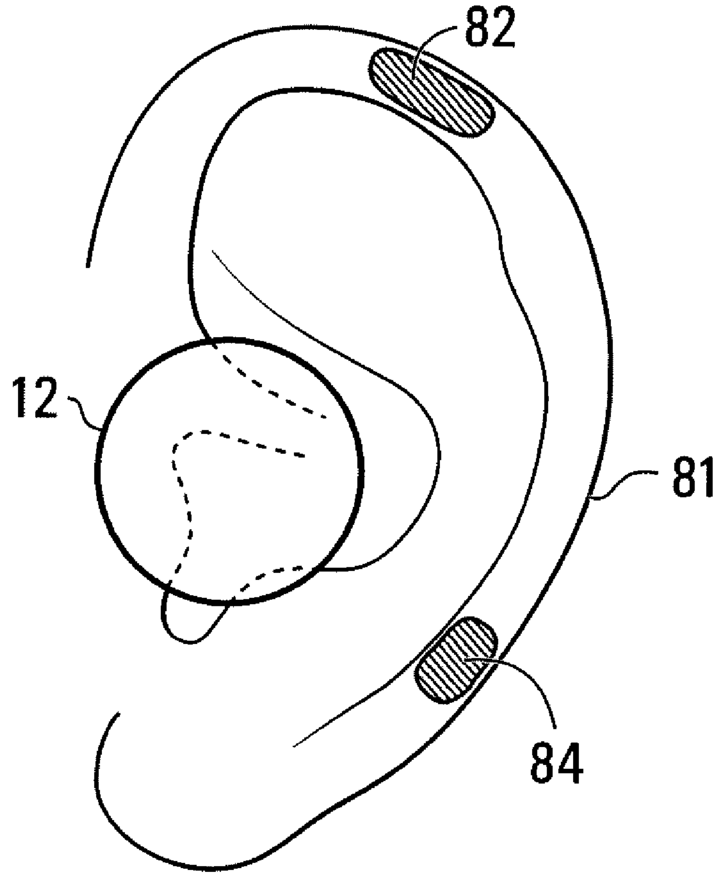
FIG. 7A illustrates regions of touch contact of an ear about a speaker port of an electronic device.

As noted above, the general approach for identifying a high degree of seal (although not the only approach, as described below) is to detect touch contact on opposite sides of the speaker port. However, it will be appreciated that areas of touch contact may not occur on exactly opposite sides of the speaker port. For instance, as illustrated in FIG. 7A, when a device having a speaker port 12 and at least one touch sensor (not expressly illustrated) mounted in fixed relation to the speaker port is positioned so that the speaker port 12 is aligned, more or less, with ear 81, and so that there are two regions 82, 84 of ear contact with the touch sensor(s), the question of whether the regions 82 and 84 are on "opposite" sides of the speaker port 12 could be answered in the affirmative or in the negative depending upon one's definition of "opposite" (i.e. depending upon how much offset of the speaker port from a position directly between the regions is permissible). In order to permit the degree of "oppositeness" required for a conclusion of a high degree of ear seal to be adjusted, the technique illustrated in FIGS. 7B and 7C may be used.

Figure 7B:
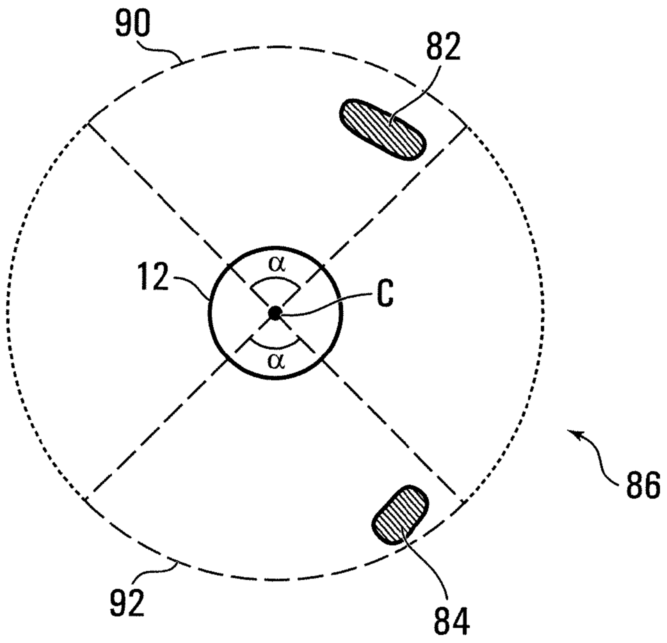
FIG. 7B shows an approach for assessing the touch contact of FIG. 7A as indicating a sealed condition.
Figure 7C:
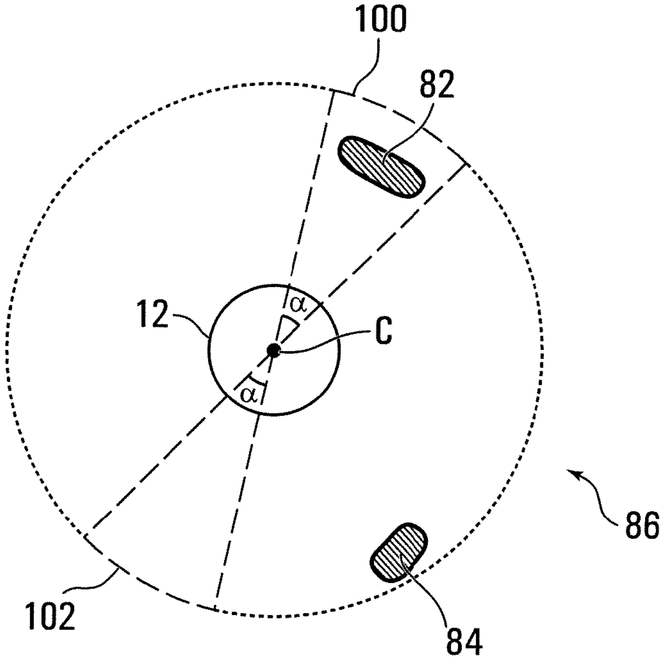
FIG. 7C shows an approach for assessing the touch contact of FIG. 7A as indicating a leak condition.

FIG. 7B illustrates the speaker port 12 of FIG. 7A, with its center labeled C. The two regions of touch contact 82, 84 of FIG. 7A are also illustrated in FIG. 7B, but ear 81 is omitted for clarity. To estimate a high degree of seal (at S502, FIG. 5), a notional circle 86 is centered about the center C of the speaker port 12. The circle occupies a plane within which the speaker port 12 and surface(s) of the touch sensor(s) also substantially reside (i.e. the plane within which the speaker port and touch sensor(s) reside are substantially coplanar). If two directly opposing sectors 90, 92, each spanning $\alpha$ degrees, can be rotated about center C such that the touch contact occurs within the sectors (even if not wholly within the sectors), a high degree of seal is estimated to exist. Otherwise, a low degree of seal is estimated to exist. Generally, the value of $\alpha$ should be less than 90 degrees. For example, in FIG. 7A, $\alpha$ is just under 90 degrees (e.g. 89 degrees). Because region 82 occurs within sector 90 and region 84 occurs within sector 92 (at least partly), the degree of seal is estimated to be high.

When the value of $\alpha$ is reduced, however, the outcome may differ. For example, in FIG. 7C the span $\alpha$ of each of the sectors 100, 102 is only 30 degrees. The directly opposing sectors 100, 102 cannot be rotated about the center C of circle 86 so that the touch contact 82 and touch contact 84 (which is the same as in FIG. 7B) occurs in opposing sectors, even in part. As a result, the degree of seal is estimated to be low, not high. This illustrates the configurability of the "high degree of seal" versus "low degree of seal" determination through of adjustment of $\alpha$. A GUI may be provided to facilitate such adjustment.

In some embodiments, the touch contact may be required to occur either entirely within directly opposing sectors or primarily within directly opposing sectors, in order for the degree of seal to be estimated as high.

In some embodiments, instead of basing the high versus low degree of seal determination of S502 (FIG. 5) upon whether touch contact occurs on opposite sides of a speaker port (as disclosed above), an alternative approach is used wherein the size of an arc of substantially continuous touch contact between the ear and the touch sensor(s) about the center of a speaker port forms the basis for distinguishing a high degree of seal from a low degree of seal. This is illustrated in FIGS. 8A and 8B.

Figure 8A:
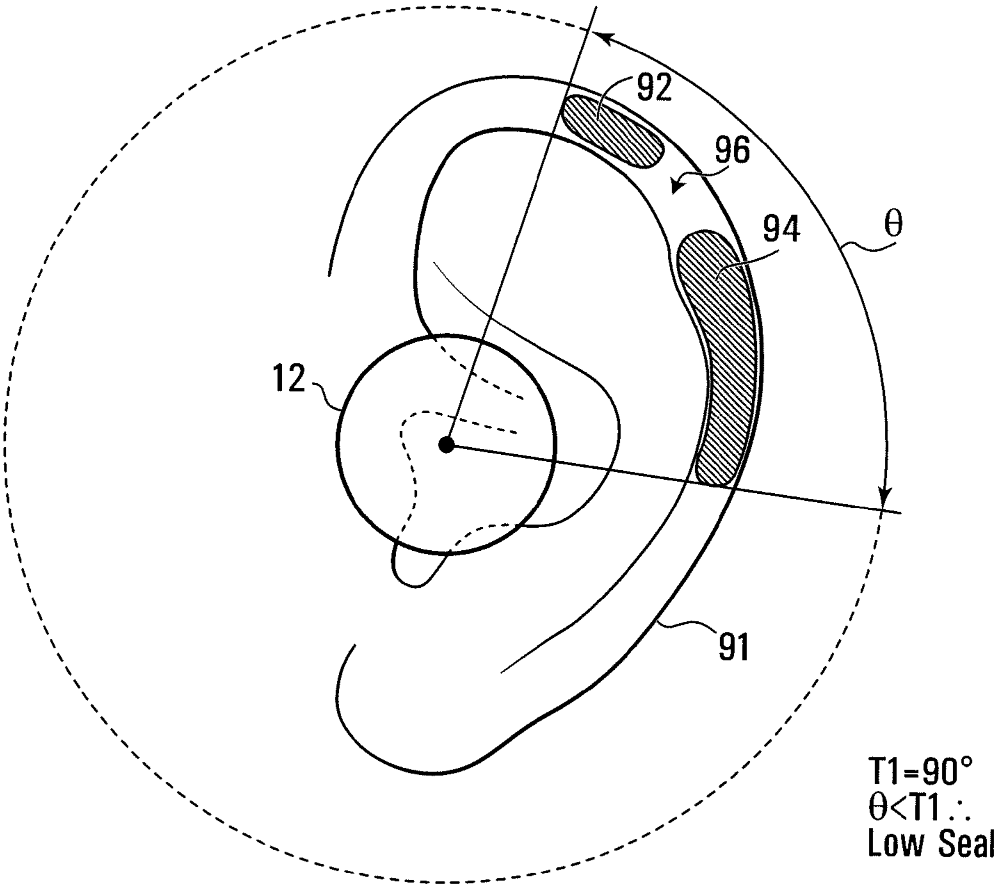
FIG. 8A shows an alternative approach for estimating a sealed condition.
Figure 8B:
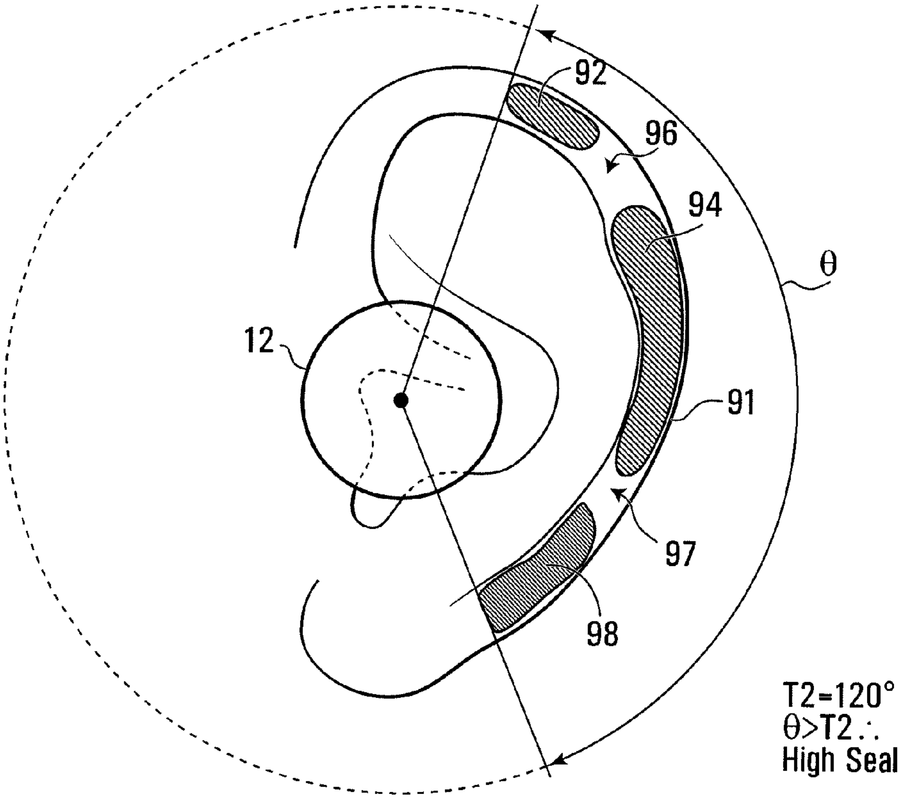
FIG. 8B shows an alternative approach for estimating a leak condition.

Referring to FIG. 8A, a device having a speaker port 12 and at least one flush mounted touch sensor (not expressly illustrated) in fixed relation to the speaker port is shown positioned so that the speaker port 12 is aligned, more or less, with ear 91. The ear touches the touch sensor(s) in only two regions 92, 94. In S502 (FIG. 5), the totality of touch sensor contact is determined to be substantially continuous over an arc of a notional circle concentric with speaker port 12, that spans $\theta$ degrees. The touch contact is considered to be substantially continuous over the $\theta$ degree arc despite the existence of gap 96. The reason is that gap 96 between regions 92, 94 wherein the ear 91 does not contact the touch sensor(s) (possibly due to irregular ear shape) forms less than a predetermined percentage P (e.g. 50%) of that arc. The percentage P may vary in different embodiments.

Figure 9:
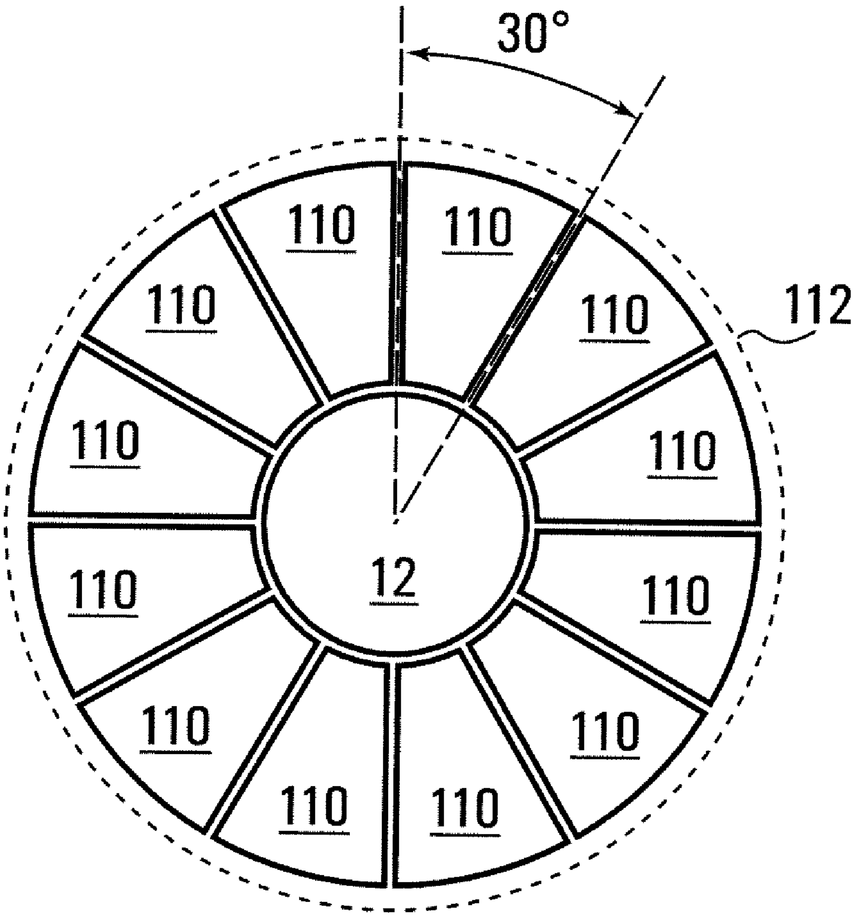
FIG. 9 illustrates a possible touch sensor arrangement.

In order to facilitate the determination (or at least estimation of), the size $\theta$ of the substantially continuous arc of ear-sensor touch contact about the center of the speaker port, sensors having a truncated wedge shape may be arranged about the speaker port as shown in FIG. 9. Referring to FIG. 9, each sensor 110 has a truncated wedge shape, with the narrower truncated end closest to the speaker port, and may occupy an angular segment, e.g. a 30 degree arc (or less, for greater precision), of a notional circle 112 that is concentric with the speaker port 12, as shown in FIG. 9. In this example, if two adjacent sensors (and no other sensors) are activated (by touch contact anywhere within their boundaries), the arc is estimated to be 60 degrees. Advantageously, the use of sensors shaped and arranged as shown in FIG. 9 so as to "radiate" from the speaker port may permit touch contact to be detected regardless of the exact proximity of the touch contact to the center of the speaker port. This may contribute to the capacity of the device 10 to estimate degrees of seal for ears of different sizes, whose points of contact with the sensors 110 may vary in distance from the center of the speaker port.

Figure 10A:
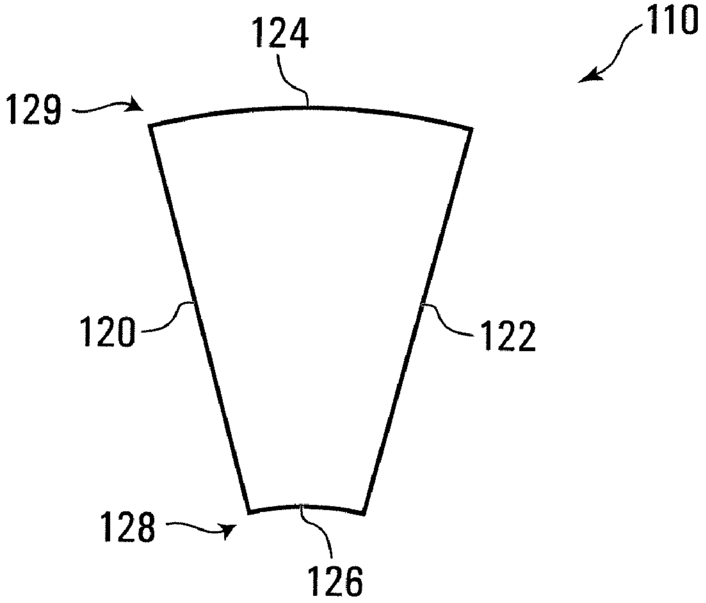
FIGS. 10A and 10B illustrate different shapes for the touch sensors of FIG. 9.
Figure 10B:
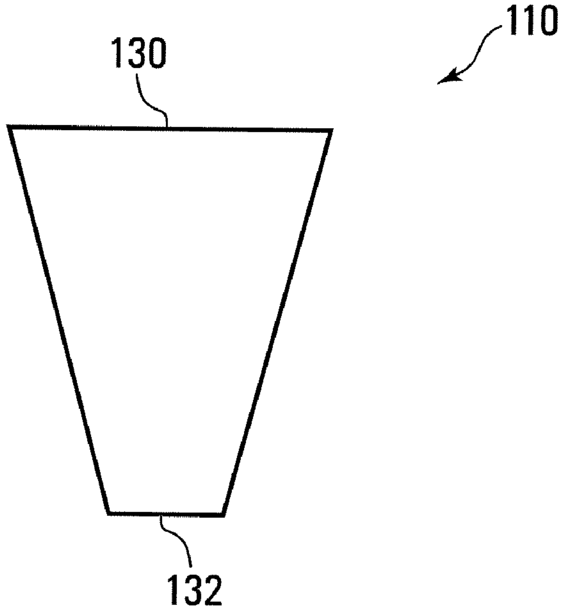
Figure 11:
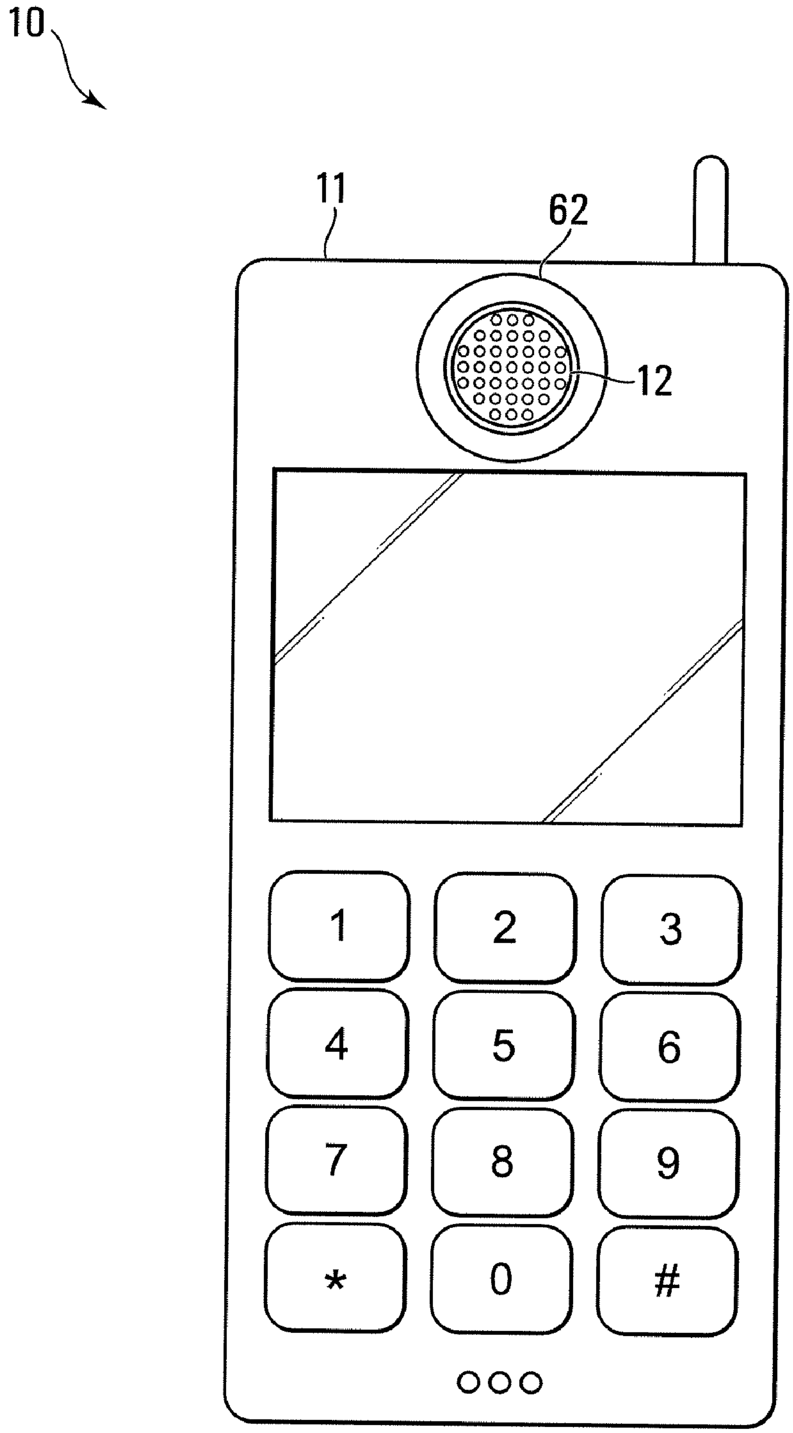
FIG. 11 shows an alternate embodiment of an electronic device with a speaker port and one touch sensor which surrounds the speaker port.

The shape of an individual sensor 110 is shown in greater detail in FIG. 10A. The shape is a plane figure bounded by two radii 120, 122 and two arcs 124, 126. Put another way, the shape is a sector of a circle with the narrow end truncated to accommodate speaker 12. The boundaries of the plane figure at its narrow end 128 and its wide end 129 are not necessarily arcs in all embodiments. For example, in an alternative embodiment, the boundaries may be straight lines 130, 132, as shown in FIG. 10B. Other shapes for these boundaries, and for the sensor 110 as a whole, are possible.

Referring again to FIG. 9, once determined, the value $\theta$ is compared to a predetermined threshold T1 (e.g. 90 degrees) used for identifying a low degree of seal. T1 may vary between embodiments (e.g. it may be user-configurable via a GUI). If $\theta$ is less than the T1 value of 90 degrees (as in the example of FIG. 8A), the degree of seal is estimated to be low.

If $\theta$ is not less than T1, as shown in FIG. 8B for example, another comparison is made with a second predetermined threshold T2 (e.g. 120 degrees) used for identifying a high degree of seal. T2 may also vary between embodiments (e.g. it may also be user-configurable via a GUI). If $\theta$ is greater than the T2 value of 120 degrees (as in the example of FIG. 8B), the degree of seal is estimated to be high. It is noted that the existence of a second gap 97 between regions 94 and 98 of touch contact does not preclude the conclusion that the contact within the arc is substantially continuous, because the extent of the gaps 96 and 97 does not exceed the above-noted, predetermined percentage P of the arc.

In order of comparison of $\theta$ with thresholds T1 and T2 may be reversed in alternative embodiments.

In another aspect of the present disclosure, a GUI may be provided whereby the user may specify his or her user characteristics (e.g. ear size) and preferences (e.g. ear seal estimation "sampling rate" or desired type of acoustic modification). In addition, or in combination, a voice sample may be output through speaker port 12 and the user may be asked to adjust his or her ear relative to speaker port 12 until the user is satisfied with the clarity of the voice sample or when it is at its loudest. At this point, the user may be directed to "press one's ear tightly against the device" and then activate a switch or other control (e.g. depress a button). In response, the device 10 may sample the sensor(s) and store in memory the particular combination of sensors or sensor area(s) that are activated/deactivated, i.e. the combination indicative of a high degree of ear seal for that specific user. This information may thereafter be used to configure the mechanism used to estimate a high degree of ear seal. For example, if the sampled sensors show that θ spans only 110 degrees and threshold T2 for determining a high degree of ear seal has a current or default value of 120 degrees, the threshold T2 may be reduced to 100 degrees (given that span of only 110 degrees, which has been confirmed by the user to represent a high degree of seal, would otherwise fail to exceed the threshold T2 and would therefore not properly result in an estimated high degree of seal).

As will be appreciated by those skilled in the art, various modifications can be made to the above-described embodiments. For example, in some embodiments, instead of having multiple touch sensors, an electronic device may have one circular touch sensor 62 that substantially surrounds speaker port 12 (FIG. 10). The touch sensor should be capable of detecting multiple areas of touch simultaneously.

It will be appreciated that certain aspects of operation 500 may vary in alternate embodiments. For instance, it may be appreciated that there may be a spectrum of degrees of seal between a fully sealed condition and a full leak condition. Accordingly, the degreeOfSeal function described above may be modified such that instead of returning a binary (i.e. LOW/HIGH) value, it returns an indication along a continuum of the degree of seal (e.g. an integer between 0 and 100 where 0 indicates a full leak condition and 100 indicates a full seal).

The estimated degree of seal may based upon experimental models. For example, experiments may be performed on a simulated ear (the simulated ear being representative, for example, of an average human ear) to derive the relationship between ear position relative to the speaker port 12 (as determined by the regions of touch detected by the one or more touch sensors) and the degree of seal. However, it may be appreciated that models derived from other sources may be employed. The estimated degree of seal may be a function of the X, Y (Cartesian) coordinates on the surface of the ear and force against the ear, with force possibly being related to the surface area touching the device.

Moreover, operating system software 27 may also incorporate models dictating how the acoustic output should be modified to compensate for a detected degree of seal. Again, the manner and degree to which the acoustic output should be modified may be determined through experimental models. For example, operating system software 27 may adjust certain frequencies of the acoustic output by causing the acoustic output to be passed through an appropriate filter prior to its output from speaker 9. It will be appreciated that the specific type of filter employed may be determined by the desired adjustment of the acoustic output. For example, a band pass filter may be used if it is desired that frequencies within a certain range (such as high frequencies) be output while frequencies outside that range (such as low frequencies) be attenuated. The filters may be implemented in software, hardware or firmware. An equalization filter may be used for this purpose; this may be a simple high/low/bandpass or shelf filter or a more complex multiband parametric filter.

Additionally, characteristics of the acoustic output other than frequency may be modified based on the estimated degree of seal. For instance, instead of attenuating low frequencies in a sealed condition, higher frequencies could be amplified to compensate for the perceived amplification of low frequencies. Other characteristics of the acoustic output may also be adjusted. For example, upon estimating a low degree of seal, the volume of the acoustic output may be increased to compensate for the leaky condition. Upon estimating a high degree of seal, the volume of the acoustic output may be decreased to in view of the estimated sealed condition. These characteristics and associated adjustments may similarly be determined through experimental models.

Generally, operation 500 may be effected by processor-executable instructions stored within device 10 in, for example, ROM. The instructions may be loaded onto device 10 from a computer-readable medium such as an optical disc 22 (FIG. 2), magnetic storage medium or by way of an over-the-air download from a wireless network. Moreover, different acoustic filters and different acoustic compensation models could be integrated with the executable instructions, or could be separately loaded on device 10 as desired. Also, the operations described above as performed by operating system 27 could be performed by application software 29 hardware or firmware.

Of course, the above described embodiments are intended to be illustrative only and in no way limiting. The described embodiments are susceptible to many modifications of form, arrangement of parts, details and order of operation. The disclosed embodiments are rather intended to encompass all such modification within the scope, as defined by the claims.

What is claimed is:

1. A method of adjusting the acoustic output of a speaker, comprising:

detecting touch contact between an ear and at least one touch sensor in fixed relation to a speaker port for the speaker;

based on said detecting, estimating a degree of seal of said ear about said speaker port; and based on the estimated degree of seal, adjusting the acoustic output of the speaker, wherein said estimating estimates a high degree of seal when the detected touch contact is on opposite sides of said speaker port.

2. The method of claim 1 wherein said adjusting comprises amplifying low frequencies of the acoustic output when the estimated degree of seal is low or attenuating low frequencies of the acoustic output when the estimated degree of seal is high.

3. The method of claim 1 wherein said adjusting comprises increasing the volume of the acoustic output when the estimated degree of seal is low or decreasing the volume of the acoustic output when the estimated degree of seal is high.

4. The method of claim 1 further comprising periodically repeating said detecting, said estimating and said adjusting during a period of contact between said ear and said at least one touch sensor.

5. A method of adjusting the acoustic output of a speaker, comprising:

detecting touch contact between an ear and at least one touch sensor in fixed relation to a speaker port for the speaker;

based on said detecting, estimating a degree of seal of said ear about said speaker port; and based on the estimated degree of seal, adjusting the acoustic output of the speaker, wherein said estimating estimates a low degree of seal when the detected touch contact fails to occur on opposite sides of said speaker port.

6. The method of claim 5 wherein said estimating estimates a low degree of seal when, in a notional circle that is concentric with said speaker port, two directly opposing sectors, each said sector spanning $\alpha$ degrees, cannot be rotated about the center of the circle such that said touch contact occurs within the opposing sectors.

7. A non-transitory machine-readable medium storing instructions which, when executed by a processor of an electronic device having a speaker and at least one touch sensor in fixed relation to a speaker port for the speaker, causes said processor to:

receive data representing touch contact between an ear and said at least one touch sensor;

based on the received data, estimate a degree of seal of said ear about said speaker port; and based on the estimated degree of seal, adjust the acoustic output of the speaker, wherein said estimating estimates a high degree of seal when the detected touch contact is on opposite sides of said speaker port.

8. The machine-readable medium of claim 7 wherein said estimating estimates a high degree of seal when, in a notional circle that is concentric with said speaker port, two directly opposing sectors, each said sector spanning $\alpha$ degrees, can be rotated about the center of the circle such that said touch contact occurs within the opposing sectors.

9. The machine-readable medium of claim 7 wherein said adjusting comprises amplifying low frequencies of the acoustic output when the estimated degree of seal is low or attenuating low frequencies of the acoustic output when the estimated degree of seal is high.

10. The machine-readable medium of claim 7 wherein said adjusting comprises increasing the volume of the acoustic output when the estimated degree of seal is low or decreasing the volume of the acoustic output when the estimated degree of seal is high.

11. A non-transitory machine-readable medium storing instructions which, when executed by a processor of an electronic device having a speaker and at least one touch sensor in fixed relation to a speaker port for the speaker, causes said processor to:

receive data representing touch contact between an ear and said at least one touch sensor;

based on the received data, estimate a degree of seal of said ear about said speaker port; and based on the estimated degree of seal, adjust the acoustic output of the speaker, wherein said estimating estimates a low degree of seal when the detected touch contact fails to occur on opposite sides of said speaker port.

12. The machine-readable medium of claim 11 wherein said estimating estimates a low degree of seal when, in a notional circle that is concentric with said speaker port, two directly opposing sectors, each said sector spanning a degrees, cannot be rotated about the center of the circle such that said touch contact occurs within the opposing sectors.

* * * * *

UNITED STATES PATENT AND TRADEMARK OFFICE

CERTIFICATE OF CORRECTION

PATENT NO. : 8,144,897 B2
APPLICATION NO. : 11/934404
DATED : March 27, 2012
INVENTOR(S) : Craig Eric Ranta It is certified that error appears in the above-identified patent and that said Letters Patent is hereby corrected as shown below:

In the Specifications:

Column 12, Lines 28-29, "said sector spanning a degrees," should be changed to -- said sector spanning $\alpha$ degrees, --.

Signed and Sealed this
Sixteenth Day of April, 2013

Teresa Stanek Rea
*Acting Director of the United States Patent and Trademark Office*